United States Patent [19]

Petty

[11] Patent Number: 4,572,968
[45] Date of Patent: Feb. 25, 1986

[54] SCR FIRE SENSITIVITY CONTROL AND FIRE CONTROL APPARATUS

[75] Inventor: Thomas D. Petty, Tempe, Ariz.

[73] Assignee: Motorola, Inc., Schaumburg, Ill.

[21] Appl. No.: 472,374

[22] Filed: Mar. 4, 1983

[51] Int. Cl.[4] .................... H03K 17/16; H03K 17/60; H03K 17/72

[52] U.S. Cl. .......................... 307/252 G; 307/252 A; 307/252 J; 307/255

[58] Field of Search ........... 307/252 A, 252 B, 252 C, 307/252 D, 252 J, 252 N, 252 Q, 254, 255, 274, 252 G, 252 H, 305; 357/38

[56] References Cited

U.S. PATENT DOCUMENTS

| 3,510,686 | 5/1970 | Zug | 307/252 N |
|---|---|---|---|
| 3,609,413 | 9/1971 | Lane et al. | 307/305 |
| 3,619,656 | 11/1971 | Domke | 307/255 |
| 4,007,378 | 2/1977 | Lazzara | 307/252 J |
| 4,015,143 | 3/1977 | Tokuhaga et al. | 307/252 J |
| 4,041,332 | 8/1977 | Ohhinata et al. | 307/252 J |
| 4,184,086 | 1/1980 | Sagawa et al. | 307/252 J |
| 4,365,170 | 12/1982 | Okuhara | 307/252 A |

Primary Examiner—John Zazworsky
Attorney, Agent, or Firm—Eugene A. Parsons

[57] ABSTRACT

An SCR with a fire sensitivity control circuit connected to one of the gates to greatly reduce the sensitivity of the SCR during initial turn-on of a potential source thereacross and fire pulse generating circuitry connected to a second gate of the SCR for firing the SCR at a desired time after the potential source has reached its normal value.

3 Claims, 3 Drawing Figures

SCR FIRE SENSITIVITY CONTROL AND FIRE CONTROL APPARATUS

BACKGROUND OF THE INVENTION

Silicon controlled rectifiers (SCR) are essentially two transistors, a PNP transistor and an NPN transistor interconnected to form a four layer PNP device. In the off state, the SCR presents an extremely high impedance to the flow of current therethrough. Several mechanisms exists by which an SCR can be turned on. Most commonly, current is applied to the base region of one of the two transistors making up the SCR by means of a voltage applied across the emitter and base of this transistor. However, because a pn junction has capacitance, the application of a rapid voltage change across the anode and cathode of the SCR creates a charging current which flows through the device from the anode to the cathode. When this charging current exceeds the value necessary to increase the common emitter current gains of the two transistors making up the SCR to a large enough value to turn the SCR on, the SCR turns on independently of the current in either of the gate electrodes. This turning on of the SCR in response to the rapid voltage change thereacross is undesirable when the SCR is designed to be controlled solely by a gate current.

In the prior art, many gate control circuits have been designed whereby the sensitivity of the SCR is greatly reduced during the application of a voltage thereacross. Once the supply voltage reaches a steady state across the SCR and the danger of a premature turn-on has passed, the gate control circuitry turns off to raise the sensitivity of the SCR and allow the application of a firing pulse thereto. In every instance the same circuitry is used to alter the sensitivity of the SCR and to fire the SCR at the desired time. This greatly limits the flexibility of the circuitry which can be used in conjunction with the SCR for altering the sensitivity and for firing the SCR at the desired time. In many instances this inflexibility, or inability to mix different types of semiconductor circuitry (e.g., NPN transistors and PNP transistors) greatly limits the usefulness of an SCR.

SUMMARY OF THE INVENTION

A silicon controlled rectifier having two control gates with a semiconductor switch connected between one of the gates and a main terminal of the SCR and a fire sensitivity control circuit connected to the control terminal of the switch to greatly reduce the sensitivity of the SCR during the turn-on of a source of potential thereacross and a fire pulse generating circuit connected to the other gate of the SCR for controlling the firing of the SCR after the potential source has reached a normal value and the sensitivity of the SCR has been returned to normal. Because the sensitivity control circuitry is connected to one gate and the fire pulse generating circuitry is connected to the other gate, greater flexibility of the interface of the circuits with the SCR is allowed.

The fire sensitivity control circuitry is constructed to maintain the sensitivity of the SCR at a greatly reduced value during initial turn-on of a source of potential and to return the sensitivity to a normal value subsequent to the source of potential reaching its normal value. Thus, the SCR can not be turned on prematurely by the sudden rise in the source of potential thereacross.

It is an object of the present invention to provide new and improved SCR fire control apparatus.

It is a further object of the present invention to provide greater flexibility of the interface between fire sensitivity control circuitry, fire pulse generation circuitry and the SCR being controlled.

It is a further object of the present invention to provide improved fire sensitivity control circuitry for an SCR.

These and other objects of this invention will become apparent to those skilled in the art upon consideration of the accompanying specification, claims and drawings.

BRIEF DESCRIPTION OF THE DRAWINGS

Referring to the drawings wherein like characters indicate like parts throughout the figures.

DESCRIPTION OF THE PRIOR ART

Figure 1:
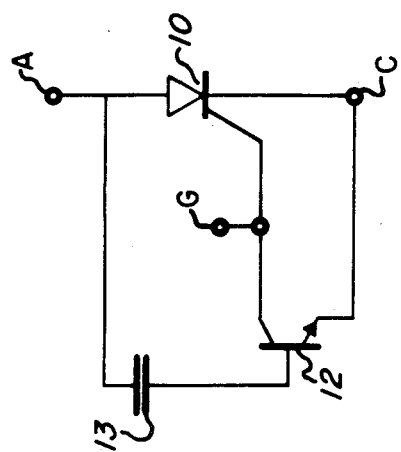
FIG. 1 is a schematic diagram of an SCR having prior art false triggering protection circuitry connected thereto.

Referring specifically to FIG. 1, an SCR 10 is illustrated, which is essentially two transistors, a PNP transistor and an NPN transistor interconnected to form a four layer PNPN device as is well known in the art. One main current carrying terminal, designated A, is generally referred to as the anode and a second main current carrying terminal, designated C, is generally referred to as the cathode. A gate, designated G, is connected to the base region of one of the two transistors making up the SCR 10. An NPN transistor 12 includes a collector connected to the gate G and an emitter connected to the cathode C. The base of the transistor 12 is connected through a capacitor 13 to the anode A.

In the operation of this prior art circuitry, the capacitor 13 transmits any voltage transients on the anode A to the base of the transistor 12. The transistor 12 then provides a conductive path to short circuit the gate G of the SCR 10 to the cathode C. This prevents the SCR 10 from turning on in response to the voltage transient. When it is desired to turn on the SCR 10 a fire pulse is applied to the gate G in the normal manner. However, because the transistor 12 must be a specific type, the circuitry which supplies the fire pulse to the gate G is greatly limited in structure and the type of transistor devices which may be used.

DESCRIPTION OF THE PREFERRED EMBODIMENT

Figure 2:
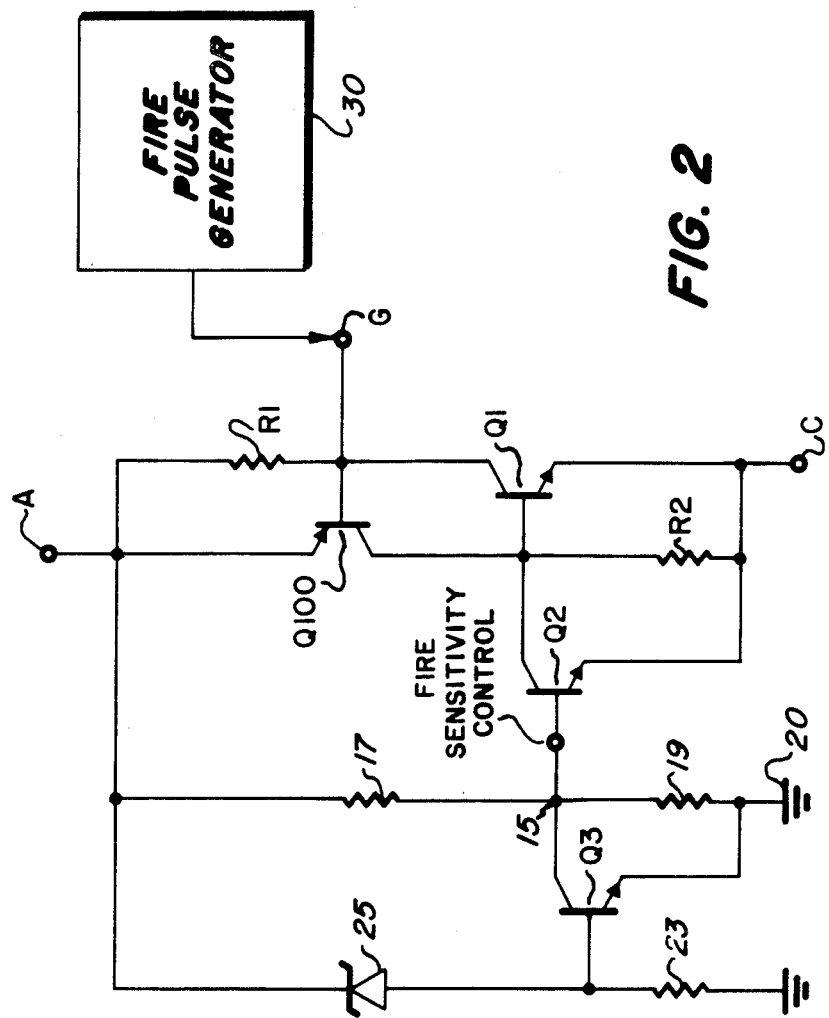
FIG. 2 is a schematic diagram of a silicon controlled rectifier with fire sensitivity control circuitry connected thereto which embodies the present invention.

Referring specifically to FIG. 2, an SCR is illustrated as a first transistor designated Q1 and a second transistor designated Q100 with the collectors and bases interconnected and the emitter of transistor Q100 designated as the anode A and the emitter of the transistor Q1 designated as the cathode C. A resistor R1 is connected between the emitter and base of the transistor Q100 to set the sensitivity thereof at a predetermined value and a second resistor R2 is connected between the base and emitter of transistor Q1 to set the sensitivity thereof at a predetermined value. An NPN transistor Q2 has a collector connected to the base of transistor Q1 and an emitter connected to the emitter of the transistor Q1.

The base of the transistor Q2 forms a fire sensitivity control input terminal. When the transistor Q2 is conducting, it presents a very low resistance between the base and emitter of the transistor Q1, thereby greatly reducing the sensitivity of the SCR. When the transistor Q2 is non-conducting, the SCR can be triggered by a fire pulse in the usual fashion.

The base of transistor Q2 is connected to a mid point 15 on a voltage divider network made up of a resistor 17, connected from the point 15 to the anode A, and a resistor 19, connected from the point 15 to a reference potential, such as ground 20. It will of course be understood that the anode A is adapted to be connected to a source of positive potential (not shown). A second NPN transistor Q3 has a collector connected to the mid point 15 and an emitter connected to the reference ground 20. The base of the transistor Q3 is connected through a resistor 23 to ground and through a Zener diode 25 to the positive potential at the anode terminal A.

The operation of the fire sensitivity control circuitry attached to the SCR of FIG. 2 is essentially as follows. When a source of positive potential, connected to the anode A, is initially turned on a finite amount of time is required before it reaches a stable, or normal, value. At the initial turn-on the voltage divider network applies a voltage, by way of the mid point 15, to the base of transistor Q2. Q2 becomes conducting and provides a low impedance between the base and emitter of transistor Q1 so that the sensitivity of the SCR is greatly reduced. With the greatly reduced sensitivity the SCR cannot be inadvertently triggered by the rising positive voltage supplied between the anode A and the cathode C. When the positive voltage at the anode A rises to approximately its stable, or normal, value the Zener diode 25 acting as a potential sensing device breaks down and conducts current through the resistor 23. The conduction of current through the resistor 23 supplies turn-on current to the base of the transistor Q3 which, as it becomes conducting, essentially shorts the mid point 15 to ground 20. Grounding the base of transistor Q2, turns transistor Q2 off so that the sensitivity of the SCR is returned to normal.

The base of transistor Q100 is connected to an external gate terminal G which in turn has fire pulse generating circuitry 30 connected thereto. Once the sensitivity of the SCR is returned to normal a fire pulse can be generated in the circuitry 30 and supplied to the gate G of the SCR to control the firing thereof. Since the fire pulse generating circuitry 30 is completely disassociated from the fire sensitivity control circuitry, i.e., NPN transistors Q2 and Q3, the circuitry 30 is not limited to any specific type of circuitry, e.g., NPN transistors, and the type and variety of circuitry which can be used to trigger the SCR is greatly enhanced.

Figure 3:
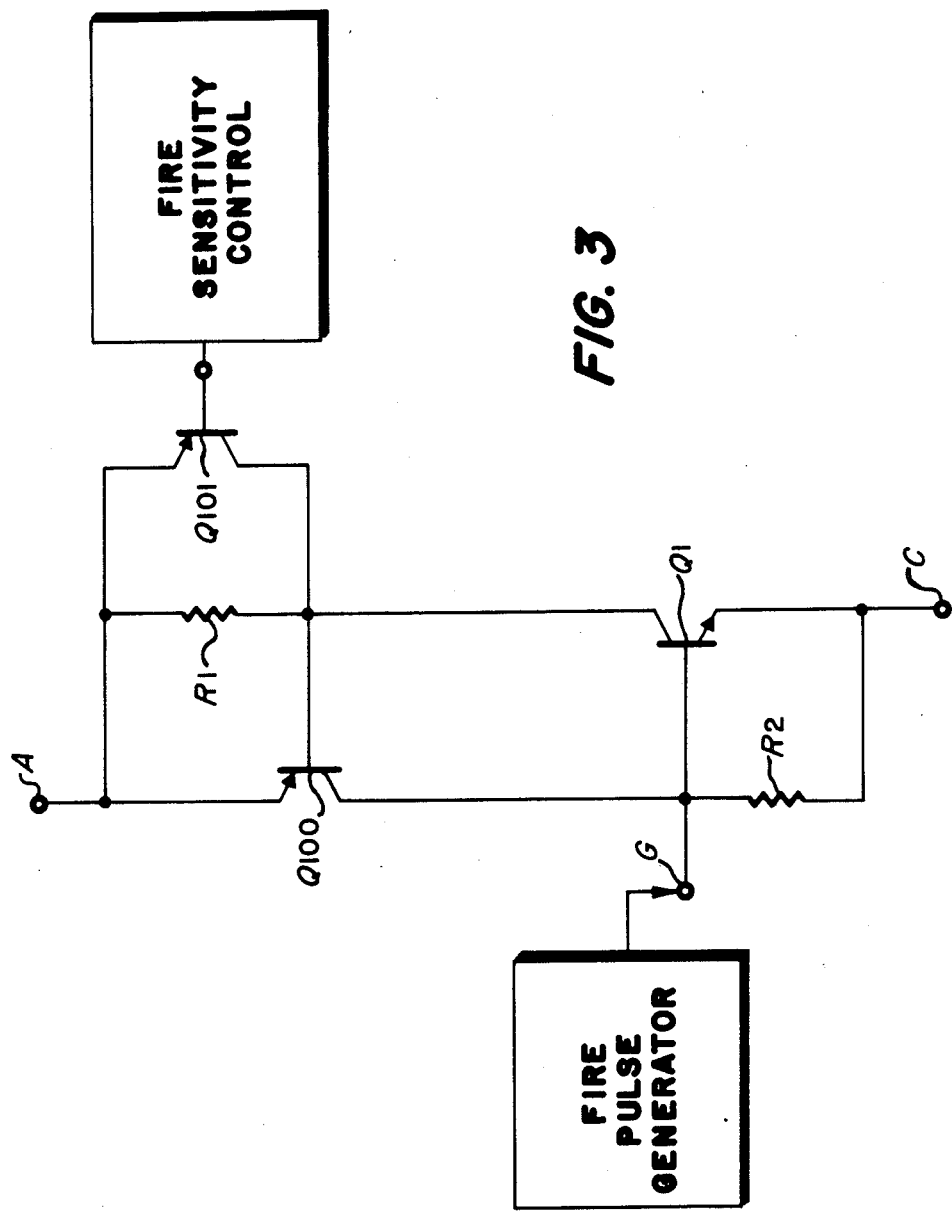
FIG. 3 is a schematic/block diagram of an SCR having circuitry similar to that illustrated in FIG. 2 connected thereto but in a different configuration.

Referring to FIG. 3, an SCR circuit similar to that illustrated in FIG. 2 is disclosed. However, in this circuit the fire sensitivity control circuitry is attached to the base of a PNP transistor Q101, the emitter of which is connected to the anode A of the SCR and the collector of which is connected to the base of transistor Q100. Further, a fire pulse generator is connected to an external gate G which is connected to the base of the transistor Q1 in the SCR. Thus, while the fire sensitivity control circuitry is practically limited to PNP type transistors to interface with transistor Q101, the fire pulse generator is not limited to any specific type of transistors or semiconductor devices.

It will of course be understood by those skilled in the art that the transistors Q2, Q3 and Q101 will generally be switching transistors which normally operate in one of two modes. When the switching transistor is conducting it provides a very low impedance and when the switching transistor is non-conducting it provides a very high impedance. It should also be understood that other semiconductor switching devices might be utilized, including field effect transistors and transistors which do not switch between conducting and non-conducting modes, but in fact operate continuously therebetween so that the sensitivity of the SCR can be continuously varied from an extremely high sensitivity.

Accordingly, silicon controlled rectifier fire control apparatus is disclosed which provides a variable fire sensitivity in an SCR to prevent large transient currents within the SCR from unintentionally firing the circuit. Further, the fire sensitivity control circuitry is attached to one gate of the SCR while the fire pulse generating circuitry is attached to a second gate of the SCR so that the two circuits are completely separated to allow greater flexibility of the interface of the circuits with the SCR. While I have shown and described specific embodiments of this invention, further modifications and improvements will occur to those skilled in the art. I desire it to be understood, therefore, that this invention is not limited to the particular forms shown and I intend in the appended claims to cover all modifications which do not depart from the spirit and scope of this invention.

I claim:

1. Silicon controlled rectifier fire control apparatus comprising:

a silicon controlled rectifier having two control gates and two main current carrying terminals;

semiconductor switch means having two controlled terminals, with a low resistance therebetween in a first mode and a high resistance therebetween in a second mode, and a control terminal for changing said switch means from the first mode to the second mode upon the application of a signal thereto, one of the controlled terminals being connected to one of the two control gates of said rectifier and the other of the controlled terminals being connected to one of the main current carrying terminals of said rectifier;

first sensitivity control circuitry connected to the control terminal of said switch means for supplying signals thereto for changing said switch means between the first and second modes, said fire sensitivity control circuitry including a voltage divider network connected to a source of potential and to a reference potential with the control terminal of the switch means being connected to a midpoint potential between the source and the reference, second semiconductor switch means having two controlled terminals, with a low resistance therebetween in a first mode and a high resistance therebetween in a second mode, and a control terminal for changing said switch means from the first mode to the second mode upon the application of a signal thereto, one of the controlled terminals being connected to the midpoint potential of said voltage divider network and the other controlled terminal being connected to the reference potential, potential sensing means connected to the source of potential and the control terminal of the said second semiconductor switch means for maintaining said second semiconductor switch means in the second mode after turn-on of the source of potential until the source of potential substantially reaches a normal value and switching said second semiconductor switch means to the first mode thereafter;

fire pulse generating means connected to the other of the two control gates of said silicon controlled rectifier.

2. Control apparatus as claimed in claim 1 wherein the potential sensing means includes a Zener diode connected to the source of potential and the control terminal of said second semiconductor switch.

3. Silicon controlled rectifier fire control apparatus comprising:

a silicon controller rectifier having two control gates and two main current carrying terminals;

a first transistor having a first electrode connected to one of the control gates of said silicon controlled rectifier, a second electrode connected to one of the main current carrying terminals of said silicon controlled rectifier, and a control electrode;

a voltage divider network connected to a source of potential and to a reference potential with the control electrode of said first transistor being connected to a midpoint potential of said voltage divider network;

a second transistor having a first electrode connected to the midpoint potential of said voltage divider network, a second electrode connected to the reference potential, and a control electrode; and a Zener diode connected to the source of potential and to the control electrode of said second transistor and a resistor connected to the control electrode of said second transistor and to the reference potential for holding said first transistor on until the source of potential substantially reaches a normal value and for turning said second transistor on and said first transistor off thereafter.

* * * * *